(12) United States Patent
Lu et al.

(10) Patent No.: US 11,127,471 B2
(45) Date of Patent: Sep. 21, 2021

(54) READ RETRY THRESHOLD VOLTAGE SELECTION

(71) Applicant: SK hynix Inc., Icheon-si (KR)

(72) Inventors: Xuanxuan Lu, San Jose, CA (US); Fan Zhang, San Jose, CA (US); Chenrong Xiong, San Jose, CA (US); Haobo Wang, Sunnyvale, CA (US); Meysam Asadi, San Jose, CA (US)

(73) Assignee: SK hynix Inc., Icheon-si (KR)

( * ) Notice: Subject to any disclaimer, the term of this patent is extended or adjusted under 35 U.S.C. 154(b) by 210 days.

(21) Appl. No.: 16/520,274

(22) Filed: Jul. 23, 2019

(65) Prior Publication Data

US 2021/0027845 A1 Jan. 28, 2021

(51) Int. Cl.
*G11C 16/26* (2006.01)
*G06F 3/06* (2006.01)
(Continued)

(52) U.S. Cl.
CPC ............ *G11C 16/26* (2013.01); *G06F 3/0604* (2013.01); *G06F 3/0659* (2013.01);
(Continued)

(58) Field of Classification Search
CPC . G11C 16/26; G11C 16/0483; G11C 16/3404; G11C 11/5671; G11C 11/5642; G11C 29/52; G11C 29/028; G11C 29/021; G11C 2029/0409; G06F 3/0604; G06F 3/0659; G06F 3/0679
See application file for complete search history.

(56) References Cited

U.S. PATENT DOCUMENTS

| 7,023,735 B2 * | 4/2006 | Ban ..................... G11C 11/5628 365/185.2 |
| 8,850,292 B2 | 9/2014 | Lee |

(Continued)

OTHER PUBLICATIONS

Y. Cai, Y. Luo, S. Ghose and O. Mutlu, "Read Disturb Errors in MLC NAND Flash Memory: Characterization, Mitigation, and Recovery," 2015 45th Annual IEEE/IFIP International Conference on Dependable Systems and Networks, 2015, pp. 438-449. (Year: 2015).*

(Continued)

*Primary Examiner* — Ramon A. Mercado
(74) *Attorney, Agent, or Firm* — Weaver Austin Villeneuve & Sampson LLP

(57) ABSTRACT

Embodiments describe a method for reading data from storage that includes selecting a block of memory to read, identifying a read retry table for reading the block, determining that the read retry table for the selected block of memory needs to be updated, and reading the block of memory using a new set of read threshold voltages from the read retry table. Responsive to a successful read operation using the new set of voltages, the method can also include replacing the initial set of read voltages in the first field with the new set of read voltages, and filling the plurality of subsequent fields in the read retry table with additional sets of read threshold voltages identified from a read retry neighbor table, where at least one of the additional sets of read voltages is closest in distance to the initial set of read voltages in read voltage space.

20 Claims, 7 Drawing Sheets

(51) Int. Cl.
  *G11C 16/04* (2006.01)
  *G11C 11/56* (2006.01)
(52) U.S. Cl.
  CPC ........ *G06F 3/0679* (2013.01); *G11C 16/0483*
    (2013.01); *G11C 11/5642* (2013.01); *G11C*
    *11/5671* (2013.01)

(56) References Cited

U.S. PATENT DOCUMENTS

| | | | |
|---|---|---|---|
| 9,715,341 | B2 | 7/2017 | Kim et al. |
| 9,720,754 | B2 | 8/2017 | Karakulak et al. |
| 9,785,382 | B2 | 10/2017 | Xie |
| 9,928,126 | B1* | 3/2018 | Shappir ................ G06F 11/108 |
| 10,120,589 | B2 | 11/2018 | Jung |
| 10,269,436 | B2 | 4/2019 | Matsunaga |
| 10,304,559 | B2 | 5/2019 | Naik |
| 2008/0094907 | A1* | 4/2008 | Ban ..................... G06F 11/1068 365/185.21 |
| 2013/0185612 | A1 | 7/2013 | Lee et al. |
| 2016/0005480 | A1 | 1/2016 | Kim et al. |
| 2017/0235633 | A1 | 8/2017 | Park |
| 2017/0309343 | A1 | 10/2017 | Lim |
| 2018/0246782 | A1 | 8/2018 | Zeng |
| 2019/0108091 | A1 | 4/2019 | Chen |
| 2020/0043557 | A1* | 2/2020 | Cai ..................... G11C 11/5642 |
| 2021/0027845 | A1* | 1/2021 | Lu .......................... G11C 29/52 |

OTHER PUBLICATIONS

Kim et al. "A 512-Gb 3-b/Cell 64-Stacked WL 3-D-NAND Flash Memory" "Published in: IEEE Journal of Solid-State Circuits ( vol. 53 , Issue: 1 , Jan. 2018 )pp. 124-133, Date of Publication: Aug. 15, 2017 ISSN Information: INSPEC Accession No. 17482442DOI: 10.1109/JSSC.2017.2731813Publisher: IEEE".

Lee et al. "A 1Tb 4b/Cell 64-Stacked-WL 3D NAND Flash Memory with 12MB/s Program Throughput" "Published in: 2018 IEEE International Solid-State Circuits Conference—(ISSCC)Date of Conference: Feb. 11-15, 2018 Date Added to IEEE Xplore: Mar. 12, 2018 ISBN Information:Electronic ISSN: 2376-8606INSPEC Accession No. 17617987DOI: 10.1109/ISSCC.2018.8310323Publisher: IEEEConference Location: San Francisco, CA, USA".

* cited by examiner

| Set of Read Voltages 802 | First Nearest Neighbor 804 | Second Nearest Neighbor 806 | | Nth Nearest Neighbor 808 |
|---|---|---|---|---|
| RR0 | RR1 | RR3 | ... | RR27 |
| RR1 | RR4 | RR5 | ... | RR35 |
| RR2 | RR6 | RR9 | ... | RR29 |
| RR3 | RR5 | RR12 | ... | RR38 |
| RR4 | RR15 | RR11 | ... | RR24 |
| RR5 | RR12 | RR2 | ... | RR31 |
| RR6 | RR3 | RR4 | ... | RR19 |
| RR7 | RR9 | RR14 | ... | RR8 |
| ⋮ | ⋮ | ⋮ | ⋮ | ⋮ |
| RRN | RR29 | RR42 | ... | RR48 |

READ RETRY THRESHOLD VOLTAGE SELECTION

BACKGROUND

Non-volatile memory devices such as Solid State Drives (SSDs) are finding new applications in consumer electronics. For example, they are replacing Hard Disk Drives (HDDs), which typically include rapidly rotating disks (platters). Non-volatile memories, sometimes referred to as 'flash memories' or 'flash memory devices' (e.g., NAND and NOR flash memory devices), are used in media storage, cameras, mobile phones, mobile computers, laptop computers, USB flash drives, etc. Non-volatile memory can provide a relatively reliable, compact, cost-effective, and easily accessible method of storing data when the power is off.

NAND flash devices are generally made up of blocks comprising a number of pages. Each page can comprise multiple NAND flash cells, e.g., hundreds or thousands. A NAND flash cell may be a single level cell (SLC) flash device that can represent one bit per cell, or a multi-level cell (MLC) flash device that can represent two or more bits per cell. For instance, a triple-level cell (TLC) NAND flash device can represent three bits per cell. Each cell can hold a voltage to indicate a value stored in physically identical flash cells. As an example, an SLC flash device can store one bit of data per cell, e.g., "1" or "0." An MLC can store two bits of data per cell and hence can support four possible states, e.g., "11", "10", "01", or "00." It will be understood that the states may represent charge states or voltage levels with reference to the flash memory implementation, and the charge states or voltage levels may depend on the amount of charge stored in the cell. Hence, MLC NAND flash devices using multiple levels per cell can be more cost-efficient because the MLC NAND flash devices can allow more bits to be stored as compared to the SLC flash devices, and are generally used for large capacity grade memory.

Data stored in cells of MLC NAND flash devices can be read by identifying a voltage level of each cell. If a voltage level is above a certain read threshold voltage, then the device can determine that the data stored in that cell is associated with a specific charge state, which can be used to determine what data is stored in that cell. Over time, repeated programming, erasing, and other stresses (e.g., exposure to high temperatures) during use of the devices can reduce the consistency/reliability at which the devices store data. That is, the amount of charge stored in some cells can change, thereby decreasing or increasing the voltage level at which the cells operate. In some instances, the voltage level can shift too far for some cells and cause data to be read incorrectly for those cells and/or cause the read operation to fail, in which case the device may attempt to retry the read operation. Retrying the read operation may increase the latency of the read operations, and thus may not reach quality of life (QoS) requirements.

SUMMARY

Embodiments of the disclosure pertain to methods, devices, and systems for improving read accuracy and latency of a NAND flash device. The method allows a device to modify its read threshold voltages to track the change in voltage levels of cells in the NAND flash device during use by a consumer. Some embodiments modify the read threshold voltages based on its proximity to other read threshold voltages in read voltage space as determined by a read retry neighbor table stored in local memory of the NAND flash device. Allowing the device to modify its read threshold voltage based on the voltage's proximity to other read threshold voltages allows the device to more accurately read the data stored in the NAND flash device and at a lower latency.

In some embodiments a method for reading data from storage includes: selecting a block of memory to read, the block of memory being a portion of a bulk memory in a memory device configured to store bits of data; identifying a read retry table for reading the block, the read retry table including a plurality of fields containing an initial set of read threshold voltages in a first field and a plurality of subsequent sets of read threshold voltages in a plurality of fields subsequent to the first field; determining that the read retry table for the selected block of memory needs to be updated; reading the block of memory using a new set of read threshold voltages from the read retry table, the new set of read threshold voltages being one of the plurality of subsequent sets of read threshold voltages in the read retry table; in response to a determination that the block has been read successfully using the new set of read threshold voltages, replacing the initial set of read threshold voltages in the first field with the new set of read threshold voltages; and filling the plurality of subsequent fields in the read retry table with additional sets of read threshold voltages identified from a read retry neighbor table to create an updated read retry table, wherein at least one of the additional sets of read threshold voltages is closest in distance to the initial set of read threshold voltages in read voltage space.

Determining that the read retry table for the selected block of memory needs to be updated can include performing a first read operation on the block of memory using the initial set of read threshold voltages, and determining that the first read operation results in a failed read operation. Determining that the read retry table for the selected block of memory needs to be updated can further include performing at least a second read operation on the block of memory using the initial set of read threshold voltages, and determining that the at least a second read operation results in a number of failed read operations that exceeds a threshold number of failed read operations. The read retry table can be a default read retry table designed to set read threshold voltages for reading the memory device in an unstressed condition. The updated read retry table can be different from the read retry table and can be designed to set read threshold voltages for reading the memory device in a stressed condition. The stressed condition can be defined by charge states of programmed cells in the block of memory whose voltage levels has shifted from their initial states after the memory device has undergone a number of program and erase cycles. The read retry neighbor table can include a first column listing a first plurality of sets of read threshold voltages, and at least one second column listing at least one other plurality of sets of read threshold voltages. The first plurality of sets of read threshold voltages can be available sets of read threshold voltages capable of being used by the memory device, and where the sets of read threshold voltages in the at least one other plurality of sets of read threshold voltages can be identified according to its distance to a corresponding set of read threshold voltages in the first plurality of sets of read threshold voltages. The at least one other plurality of sets of read threshold voltages can be arranged by separation distance to the first plurality of sets of read threshold voltages by increasing separation distances. The read retry table and the read retry neighbor table can be stored in local memory of the memory device.

In certain embodiments, a memory device includes a processor, bulk memory communicatively coupled with the processor and comprising a plurality of blocks of bulk memory configured to store data, and local memory communicatively coupled with the processor and including a read retry table, a read retry neighbor table, and computer-readable instructions. The read retry table can include several sets of read threshold voltages for reading the plurality of blocks of bulk memory that are arranged in a sequential order, the read retry neighbor table can include information pertaining to the spatial relationship between sets of read threshold voltages in read voltage space, and the computer-readable instructions upon execution by the processor can configure the memory device to: select a block of memory from the plurality of blocks of bulk memory to read; identify the read retry table for reading the block, the read retry table including a plurality of fields containing an initial set of read threshold voltages in a first field and a plurality of subsequent sets of read threshold voltages in a plurality of fields subsequent to the first field; determine that the read retry table for the selected block of memory needs to be updated; read the block of memory using a new set of read threshold voltages from the read retry table, the new set of read threshold voltages being one of the plurality of subsequent sets of read threshold voltages in the read retry table; in response to a determination that the block has been read successfully using the new set of read threshold voltages, replace the initial set of read threshold voltages in the first field with the new set of read threshold voltages; and fill the plurality of subsequent fields in the read retry table with additional sets of read threshold voltages identified from the read retry neighbor table to create an updated read retry table, wherein at least one of the additional sets of read threshold voltages is closest in distance to the initial set of read threshold voltages in read voltage space.

The read retry table is a default read retry table can be designed to set read threshold voltages for reading the memory device in an unstressed condition. The updated read retry table can be different from the read retry table and is designed to set read threshold voltages for reading the memory device in a stressed condition. The read retry neighbor table can include a first column listing a first plurality of sets of read threshold voltages, and at least one second column listing at least one other plurality of sets of read threshold voltages. The first plurality of sets of read threshold voltages can be available sets of read threshold voltages capable of being used by the memory device, where the sets of read threshold voltages in the at least one other plurality of sets of read threshold voltages can be identified according to its distance to a corresponding set of read threshold voltages in the first plurality of sets of read threshold voltages.

In some embodiments, a computer system for reading data from storage includes a host device comprising a host processor and a host memory device, and a memory device communicatively coupled to the host device and configured to store data from and send data to the host device. The memory device includes a memory device processor, bulk memory communicatively coupled with the memory device processor and comprising a plurality of blocks of bulk memory configured to store data, local memory communicatively coupled with the processor and including a read retry table, a read retry neighbor table, and computer-readable instructions. The read retry table can include several sets of read threshold voltages for reading the plurality of blocks of bulk memory that are arranged in a sequential order, the read retry neighbor table can include information pertaining to the spatial relationship between sets of read threshold voltages in read voltage space; and the computer-readable instructions upon execution by the processor can configure the memory device to: select a block of memory from the plurality of blocks of bulk memory to read; identify the read retry table for reading the block, the read retry table including a plurality of fields containing an initial set of read threshold voltages in a first field and a plurality of subsequent sets of read threshold voltages in a plurality of fields subsequent to the first field; determine that the read retry table for the selected block of memory needs to be updated; read the block of memory using a new set of read threshold voltages from the read retry table, the new set of read threshold voltages being one of the plurality of subsequent sets of read threshold voltages in the read retry table; in response to a determination that the block has been read successfully using the new set of read threshold voltages, replace the initial set of read threshold voltages in the first field with the new set of read threshold voltages; and fill the plurality of subsequent fields in the read retry table with additional sets of read threshold voltages identified from the read retry neighbor table to create an updated read retry table, wherein at least one of the additional sets of read threshold voltages is closest in distance to the initial set of read threshold voltages in read voltage space.

The read retry table can be a default read retry table designed to set read threshold voltages for reading the memory device in an unstressed condition. The updated read retry table can be different from the read retry table and is designed to set read threshold voltages for reading the memory device in a stressed condition. The read retry neighbor table can include a first column listing a first plurality of sets of read threshold voltages, and at least one second column listing at least one other plurality of sets of read threshold voltages. The first plurality of sets of read threshold voltages can be available sets of read threshold voltages capable of being used by the memory device, and where the sets of read threshold voltages in the at least one other plurality of sets of read threshold voltages can be identified according to its distance to a corresponding set of read threshold voltages in the first plurality of sets of read threshold voltages.

A better understanding of the nature and advantages of embodiments of the present disclosure may be gained with reference to the following detailed description and the accompanying drawings. It is to be understood, however, that each of the figures is provided for the purpose of illustration only and is not intended as a definition of the limits of the scope of the disclosure. Also, as a general rule, and unless it is evident to the contrary from the description, where elements in different figures use identical reference numbers, the elements are generally either identical or at least similar in function or purpose.

DETAILED DESCRIPTION

Figure 1:
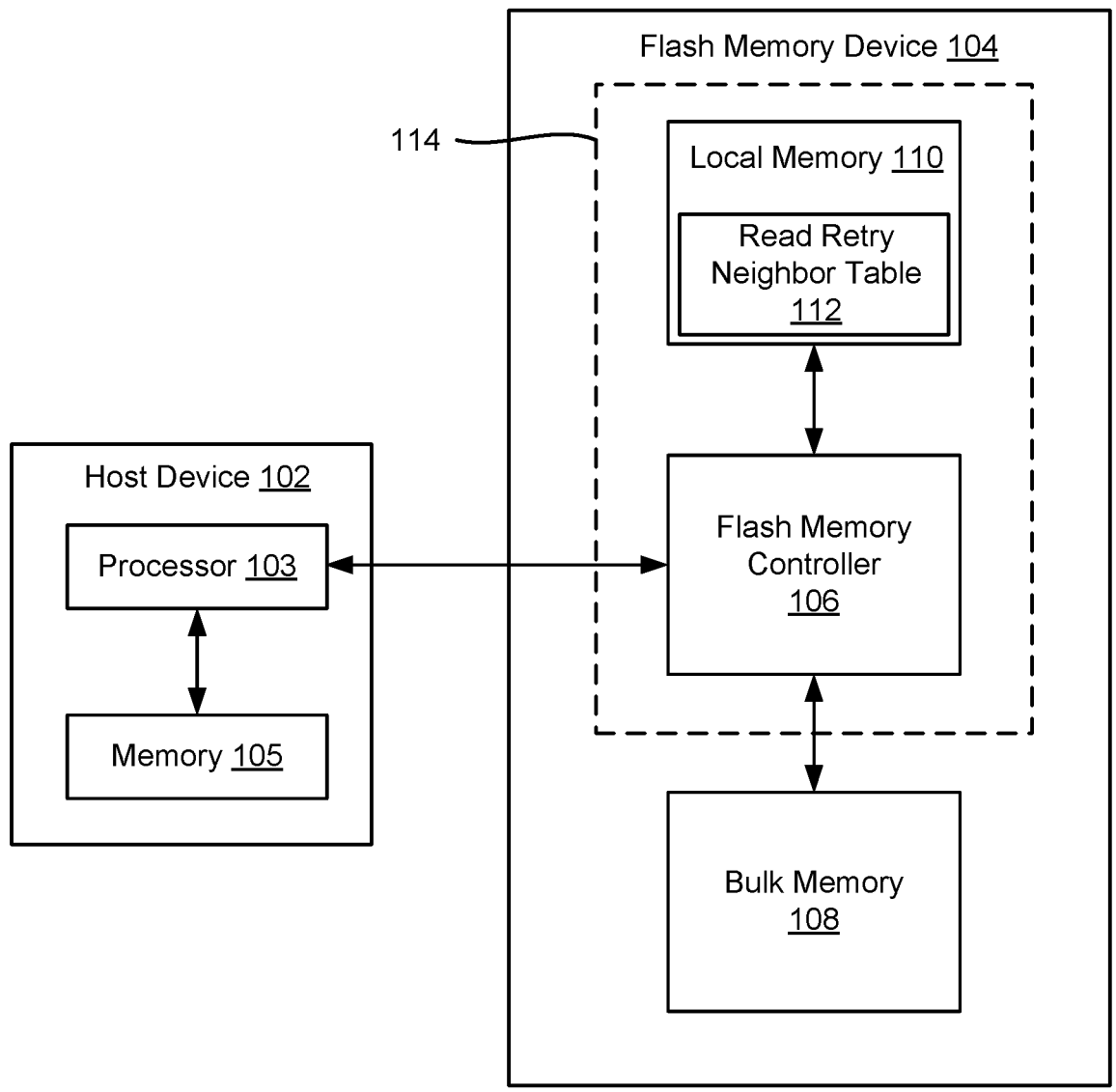
FIG. 1 is a simplified block diagram illustrating a system including a host device coupled to a flash memory device, according to some embodiments of the present disclosure.

Certain aspects and embodiments of this disclosure are provided below. Some of these aspects and embodiments may be applied independently and some of them may be applied in combination as would be apparent to those of skill in the art. In the following description, for the purposes of explanation, specific details are set forth in order to provide a thorough understanding of embodiments. However, it will be apparent that various embodiments may be practiced without these specific details. The figures and description are not intended to be restrictive.

The ensuing description provides examples, and is not intended to limit the scope, applicability, or configuration of the disclosure. Rather, the ensuing description of the exemplary embodiments will provide those skilled in the art with an enabling description for implementing an exemplary embodiment. It should be understood that various changes may be made in the function and arrangement of elements without departing from the spirit and scope of the present disclosure as set forth in the appended claims.

Specific details are given in the following description to provide a thorough understanding of the embodiments. However, it will be understood by one of ordinary skill in the art that the embodiments may be practiced without these specific details. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to, portable or non-portable storage devices, optical storage devices, and various other mediums capable of storing, containing, or carrying instruction(s) and/or data. A computer-readable medium may include a non-transitory medium in which data can be stored and that does not include carrier waves and/or transitory electronic signals propagating wirelessly or over wired connections. Examples of a non-transitory medium may include, but are not limited to, a magnetic disk or tape, optical storage media such as compact disk (CD) or digital versatile disk (DVD), flash memory, memory or memory devices. A computer-readable medium may have stored thereon code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, or the like.

Furthermore, embodiments may be implemented by hardware, software, firmware, middleware, microcode, hardware description languages, or any combination thereof. When implemented in software, firmware, middleware or microcode, the program code or code segments to perform the necessary tasks (e.g., a computer-program product) may be stored in a computer-readable or machine-readable medium. A processor(s) may perform the necessary tasks.

The following detailed description together with the accompanying drawings in which the same reference numerals are sometimes used in multiple figures to designate similar or identical structures structural elements, provide a better understanding of the nature and advantages of the present disclosure.

Embodiments of the disclosure pertain to methods, devices, and systems for improving the read operation of MLC NAND flash memory devices. Data stored in an MLC NAND flash memory device can be read according to a read retry table. The read retry table can include several sets of read threshold voltages. Each set of read threshold voltages can include one or more read threshold voltages to identify different charge states of a cell of memory, as will be discussed further herein with respect to FIGS. 3 and 4. The first set of read threshold voltages can be used by default for reading data from the memory device. Often, the first set of read threshold voltages results in a successful read of the data stored in the flash memory device.

Over time, however, continued use of the flash device can cause the voltage levels for the different charge states to change. Some voltage levels of cells in a block can decrease below its corresponding read threshold voltage defined by the initial set of read threshold voltages. Thus, the first read operation using the first set of read threshold voltages may fail for the block. If the first set of read threshold voltages cases the first read operation to fail, then the second set of read threshold voltages may be used in a second read operation of the block. If the second set of read threshold voltages causes the second read operation to fail, then the third set of read threshold voltages may be used in a third read operation of the block, and so on and so forth until a successful read operation is achieved. This process repeats every time the block is read. Thus, latency issues may arise, as well as an increase in number of read failures, especially if the read retry table stays the same.

According to some embodiments of the present disclosure, once a successful read operation is performed following an unsuccessful read operation, the flash memory device can update the read retry table with one or more new sets of read threshold voltages. The new set(s) of read threshold voltages can be selected according to a read retry neighbor table that contains data pertaining to the distance between different sets of read threshold voltages in read voltage space, as will be discussed further herein with respect to FIG. 9. The new set of read threshold voltages can be a set of read threshold voltages that are close to the initial set of read threshold voltages. The new read retry table can allow the flash memory device to read data more quickly and more accurately, without having to repeat read operations using sets of threshold voltages that are already known to fail. Accordingly, embodiments herein result in improved MLC NAND flash memory devices having lower read latency and higher read accuracy.

FIG. 1 is a simplified block diagram illustrating a system 100 including a host device 102 coupled to a flash memory device 104. Host device 102 can include any appropriate hardware device, software application, or a combination of hardware and software implemented by a host processor 103 and a host memory device 105. In some embodiments, host device 102 can include a host-side controller (not shown). Host device 102 can send requests to the flash memory device 104 to access flash memory 108, e.g., to write data into bulk memory 108 or read the data from bulk memory 116.

In some embodiments, flash memory device 104 can include a flash memory controller 106 communicatively coupled to a bulk memory 108. Flash memory controller 106 can be configured to receive various commands from the host device 102 and communicate with bulk memory 108 based on these commands. Flash memory controller 106 can enable bulk memory 108 to perform various operations based on the commands received from host device 102. For example, host device 102 can communicate with flash memory controller 106 to program, erase, read, or trim parts of bulk memory 108. Bulk memory 108 can be any suitable type of memory for storing data from host device 102, such as flash memory.

According to some embodiments of the present disclosure, flash memory controller 106 can also be communicatively coupled to a local memory 110. Local memory 110 can be any suitable non-volatile memory, such as a read-only memory (ROM). Local memory 110 can store low-level control information (e.g., firmware) for the hardware of flash memory device 104. In some embodiments, local memory 110 can store lines of code that, when instructed by flash memory controller 106, causes data to be read from bulk memory 108 using a read retry neighbor table 112. Read retry neighbor table 112 can store data pertaining to the distance between sets of read threshold voltages in read voltage space, as will be discussed further herein with respect to FIGS. 8 and 9.

In some implementations, the flash memory controller 106 and local memory 110 may be part of an apparatus 114. For example, the apparatus 114 may be implemented as a system on chip (SoC), an application specific integrated circuit (ASIC), a field programmable gate array (FPGA), or any other suitable circuit. Although local memory 110 is shown as separate and independent from bulk memory 108, embodiments are not limited to such configurations. In some embodiments, local memory 110 is implemented in bulk memory 108 so that a portion of bulk memory 108 is used to form local memory 110.

In some implementations, bulk memory 108 can be any non-volatile memory, e.g., a NAND flash. In some implementations, bulk memory 108 can be a NOR flash memory configured to interact externally as a NAND flash. Bulk memory 108 can be designed to store data in the absence of a continuous or substantially continuous external power supply. In some examples, bulk memory 108 can be used for secondary data storage, e.g., in a computer system such as a laptop. In such examples, flash memory device 104 can replace a magnetic hard disk drive (HDD). In some examples, flash memory controller 106 can be external to the flash memory device 104. In some such examples, flash memory controller 106 can interact with a plurality of flash memories. In some embodiments, other non-volatile memory can be used in place of or in addition to bulk memory 108. Examples can include read only memory (ROM), a mask ROM (MROM), a programmable ROM (PROM), an erasable programmable ROM (EPROM), an electrically erasable programmable ROM (EEPROM), Ferroelectric RAM (F-RAM), Magnetoresistive RAM (RAM), polymer-based organic memory, holographic memory, phase change memory and the like. An example structural organization of a flash memory, such as bulk memory 108, is explained with reference to FIG. 2.

Figure 2:
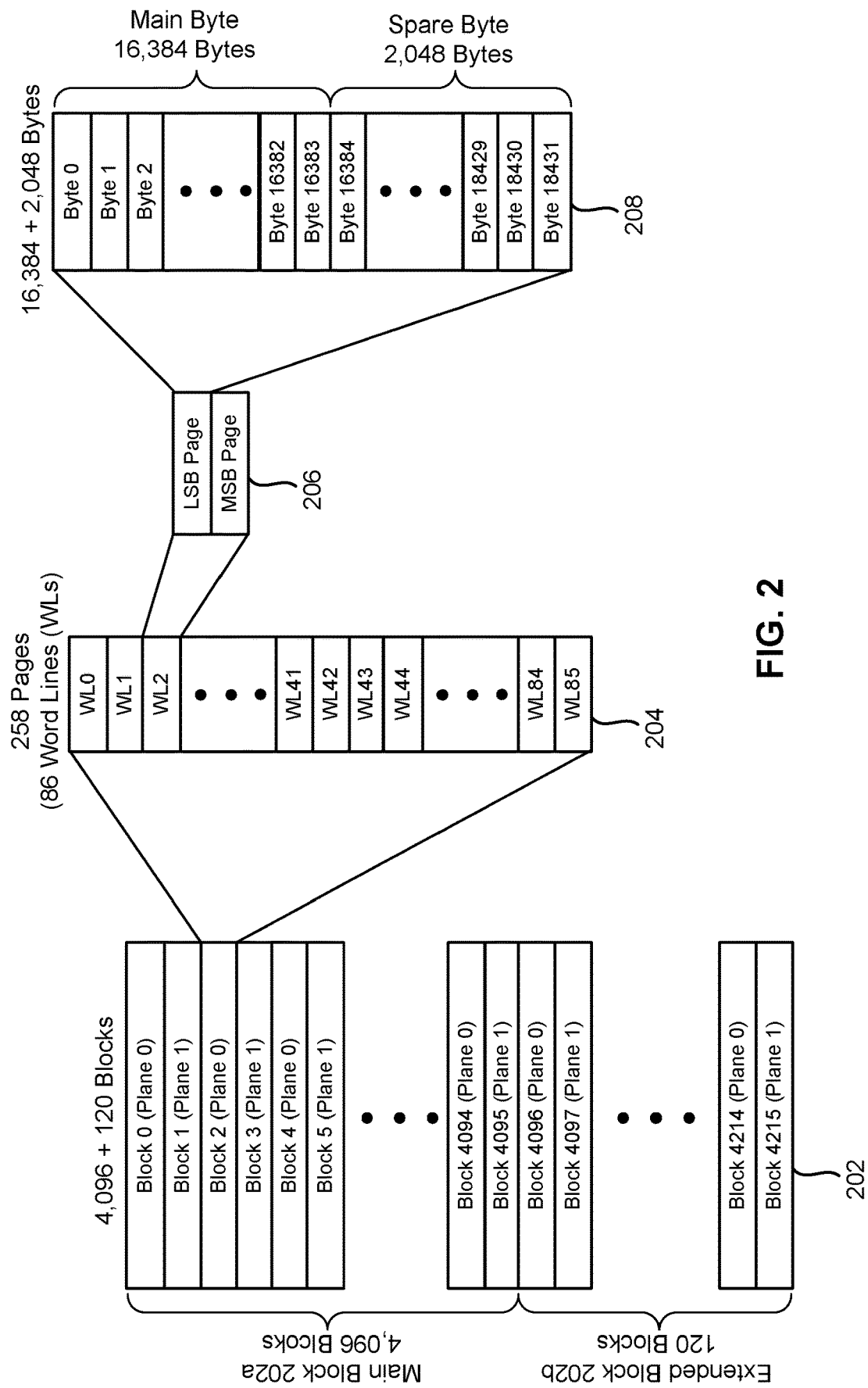
FIG. 2 is an example illustration of a structural organization of the flash memory.

FIG. 2 is an example illustration of the organization of the bulk memory 108. It is to be noted that a structure 200 shown in FIG. 2 is for illustrative purposes only and the actual physical organization of the bulk memory 108 can differ substantially from the depiction.

In some implementations, the bulk memory 108 may be implemented as a two dimensional matrix of NAND flash cells, called blocks, comprising pages (rows) and strings (columns). Within a block, all the cells in the same row can share a word line (WL). A flash memory die can comprise a plurality of blocks 202 that may include a main block 202a and an extended block 202b. In some implementations, the main block 202a may be used to store data, and the extended block 202b may be used to store auxiliary information, e.g., error correction codes, metadata related to block management (e.g., erase cycle counters, logical address information, bad block marks), etc. The plurality of blocks 202 may include blocks that can be on different planes. In the example shown in FIG. 2, there can be two planes, plane 0 and plane 1, but other examples can include different number of planes per die. A plurality of such dies can be included in a flash memory, such as the bulk memory 108. Plane 0 can include a first set of blocks, e.g., block 0, block 2, block 4, . . . , block 4214. Plane 1 can include a second set of blocks, e.g., block 1, block 3, block 5, . . . , block 4215. In the example shown in FIG. 2, the main block 202A may include 4,096 blocks and the extended block 202b may include 120 blocks. In most implementations, a block may represent the smallest erasable unit.

Each block can include a plurality of word lines. As shown in FIG. 2, a block 2 on plane 0 may include plurality of word lines 204. For example, the word lines 204 may include 86 word lines that may be equivalent to 258 pages (e.g., three pages for each word line). Generally, in an MLC NAND flash device, the two bits within a single cell are not mapped to the same page. For example, all the most significant bits (MSBs) on a word line can form an MSB page and all the least significant bit (LSBs) on the word line can form an LSB page. As shown in FIG. 2, a word line 206 represented by WL2 may correspond to an LSB page and an MSB page. The MSB page may include the MSBs associated with all the cells on the WL2, and the LSB page may include the LSBs associated with all the cells on the WL2. Each page may store a plurality of bytes that may include bytes for main data and bytes for auxiliary data. For example, the LSB page from the word line 206 may include bytes 208 comprising main bytes and spare bytes. In the example shown in FIG. 2, the LSB page from the word line 206 may include 16,384 main bytes and 2,048 spare bytes. Each page in a flash memory may represent the minimum programmable unit or the minimum readable unit. In this specification, programming or writing of a flash memory may be used interchangeably. Programming a page may be interpreted as bringing the voltage level of each cell on that page to one of the possible states based on the write data.

MLC NAND flash devices generally provide a higher cell density as compared to SLC flash devices, are cost effective, and therefore are mostly used in mass storage consumer applications. However, reading an MLC NAND flash device can be complex since there are multiple charge states for a single cell, and in order to successfully read a block of the MLC NAND flash device, the specific charge state of each cell in the block needs to be identified.

Figure 3:
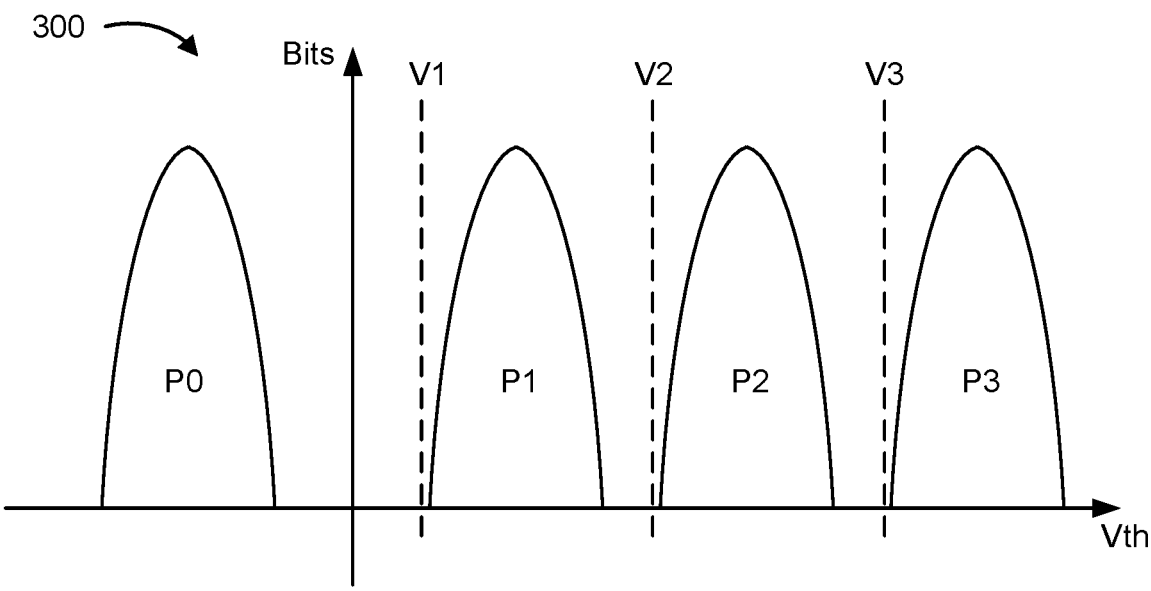
FIG. 3 is a graph showing an exemplary program distribution for a block of memory in an MLC NAND flash device, according to some embodiments of the present disclosure.

FIG. 3 is a graph 300 showing an exemplary program distribution for a block of memory in an MLC NAND flash device, according to some embodiments of the present disclosure. The y-axis represents number of bits in ascending order upward according to a logarithmic scale, and the x-axis represents threshold voltage in ascending order to the right. For the MLC NAND flash memory device, each cell can hold two bits of data; thus, each cell can be in four possible charge states: three programmed charge states P1, P2, and P3 (e.g., "01", "10", and "00" in binary, respectively) and one erased charge state P0 (e.g., "11" in binary). Each read operation can reference a set of read threshold voltages, which can include three threshold voltages, one for each of the P1, P2 and P3 charge states of the MLC NAND flash memory device. For instance, the cells in the block of memory represented by graph 300 in FIG. 3 can be read using a set of read threshold voltages: V1, V2, and V3. Those bits that are above read threshold voltage V3 can be read as P3 states having "00" data, those bits that are above read threshold voltage V2 but below V3 can be read as P2 states having "10" data, those bits that are above read threshold voltage V1 but below V2 can be read as P1 states having "01" data, and those bits that are below read threshold voltage V1 can be read as P0 states having "00" data.

In some embodiments, the set of read threshold voltages can be one of many sets of read threshold voltages that are stored as a table in local memory, e.g., local memory 110 in FIG. 1. The sets of read threshold voltages can be arranged in a specific order so that subsequent sets of read threshold voltages can be used to retry the read operation in case the initial read operation fails. Such a table can be referred to as a "read retry table (RRT)".

Figure 4:
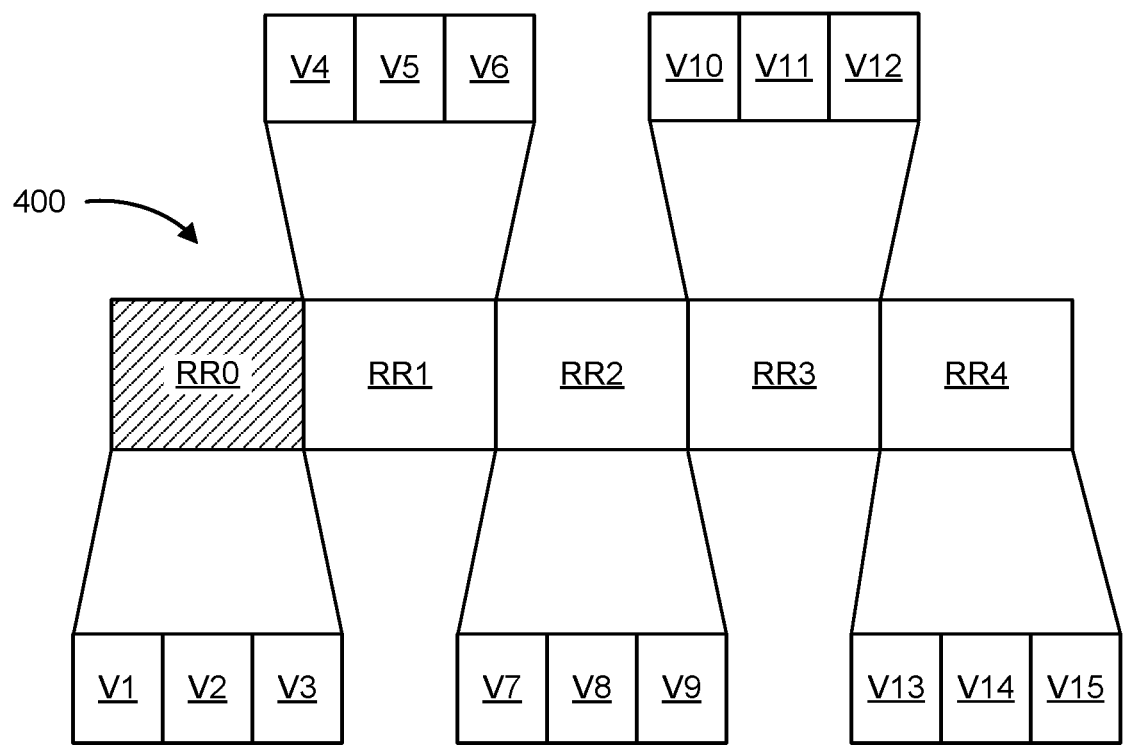
FIG. 4 is an example read retry table, according to some embodiments of the present disclosure.

FIG. 4 is an example read retry table 400, according to some embodiments of the present disclosure. RRT 400 can include five sets of read threshold voltages: RR0, RR1, RR2, RR3, and RR4. Each set of read threshold voltage can include three threshold voltages. For instance, RR0 can include threshold voltages V1, V2, and V3, RR1 can include V4, V5, and V6, RR2 can include V7, V8, and V9, and so on and so forth to RR4. Although FIG. 4 illustrates only five sets of read threshold voltages for a read retry table where each set includes three threshold voltages, embodiments are not limited to such configurations and that other embodiments can include more or less sets of read threshold voltages in a read retry table, and more or less threshold voltages for each set, without departing from the spirit and scope of the present disclosure.

RRT 400 may be an initial table that is used for every read operation of the flash memory device. In some instances, the first attempt at reading the block succeeds. For example, a read operation executed by a flash memory controller, e.g., flash memory controller 106, may reference RRT 400 and identify threshold voltages V1, V2, and V3 from the initial set of threshold voltages, e.g., RR0 as shown with hash marks. Each charge state of every cell in the block can be determined by comparing the charge state with the respective read voltages V1, V2, and V3. A successful read occurs when the flash memory device is able to determine the charge state of each cell in the block.

Figure 5:
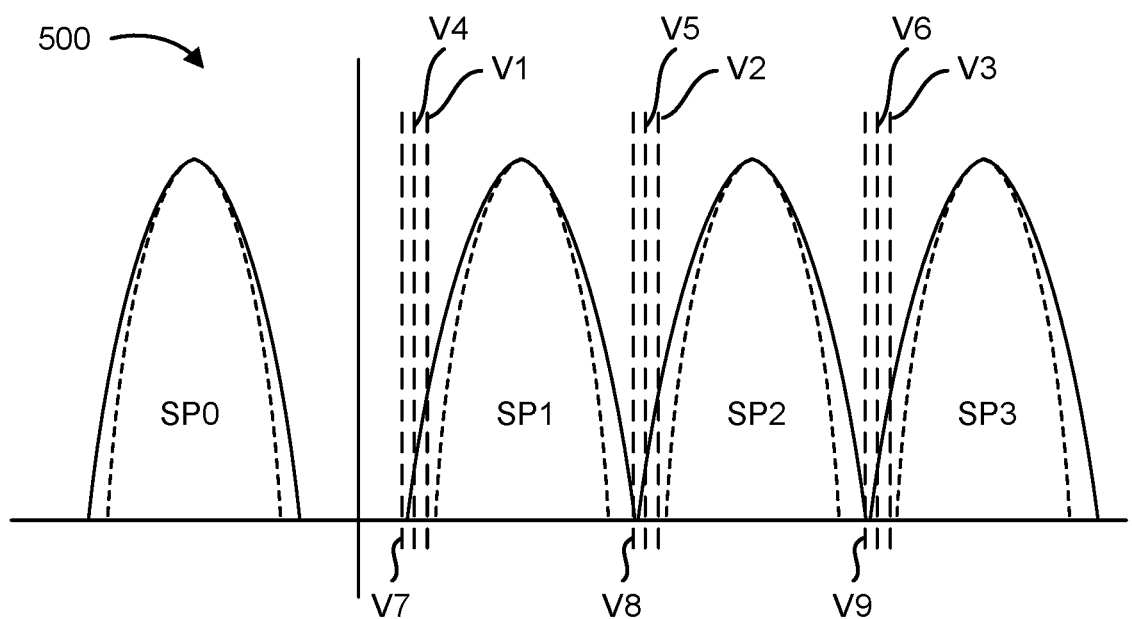
FIG. 5 is a graph showing an exemplary program distribution for a block of memory in an MLC NAND flash device after the device has experienced stress, and an image sensor array according to some embodiments of the present disclosure.

In some instances, however, a read operation may fail. This can occur when the charge state for some bits shift due to stresses, such as excessive program and erase cycles and/or exposure to high temperatures. These stresses can occur after the memory device is manufactured and sold to the consumer, and use by the consumer causes the stresses that result in shifts to the charge states. FIG. 5 is a graph 500 showing an exemplary program distribution for a block of memory in an MLC NAND flash device after the device has experienced stress, according to some embodiments of the present disclosure. For ease of comparison, stressed charge states SP0, SP1, SP2, and SP3 (shown as solid lines) are superimposed over initial, unstressed or insufficiently stressed charge states P0, P1, P2, and P3 (shown as dotted lines) from FIG. 3. As shown in FIG. 5, the distribution for each charge state SP0-SP3 has shifted from initial charge states P0-P3, due to changes in charge storage capabilities caused by stress. Thus, some cells may have voltage levels that are positioned below the corresponding read threshold value that is configured to read those cells, which may cause the read operation to fail. For instance, cells stored with charge state SP1 below initial read threshold voltage V1 may cause a read operation to fail because the device may not determine that those cells are above read threshold voltage V1 and thus may not identify that they contain "01" data.

Figure 6:
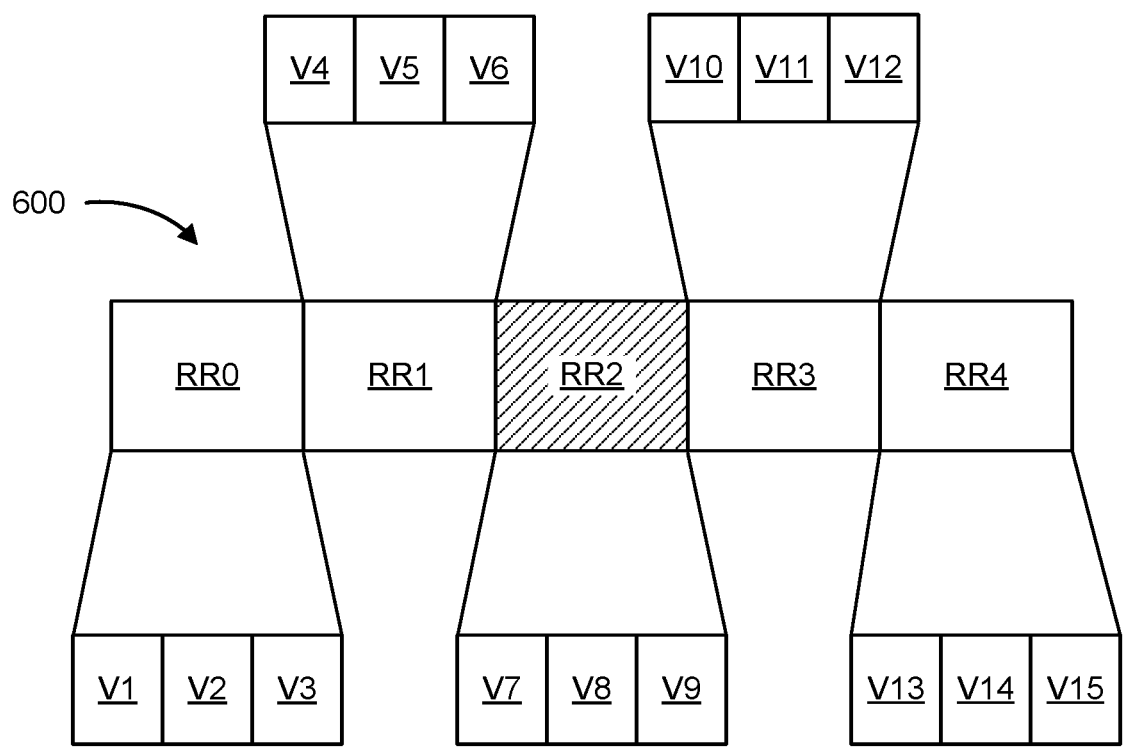
FIG. 6 is an example RRT whose third set of read threshold voltages results in a successful read operation, according to some embodiments of the present disclosure.

To compensate for such voltage level shifts for the charge states, a read retry table can be configured to provide different read threshold values for subsequent read operations in instances where the initial read fails. As an example, FIG. 6 is an example RRT 600 whose third set of read threshold voltages results in a successful read operation, according to some embodiments of the present disclosure. RRT 600 can be substantially similar to RRT 400 in FIG. 4 and include the same five default sets of read threshold voltages: RR0, RR1, RR2, RR3, and RR4. Since the charge states have shifted due to stress, the read operation may fail if using RR0 as there are some cells in the block that have voltage levels below read threshold voltages V1, V2, and V3.

If RR0 fails, then the subsequent set of read threshold voltages RR1 may be used for the next read operation. Subsequent sets of read threshold voltage can be used in subsequent read retry operations in sequential order, e.g., from left to right in one example. One or more read threshold voltages of RR1 may be lower than one or more read threshold voltages of RR0 in an attempt to track the shifting of charge states. As an example, RR1 can include read threshold voltages V4, V5, and V6 as shown in FIG. 5 which may be less than the read threshold voltages V1, V2, and V3 of RR0. Thus, more cells that have shifted voltage levels can be determined to be in the correct charge state. However, some cells in the block may have charge states that are still not able to be read by read threshold voltages V4, V5, and V6. Thus, the read operation using RR1 may also fail. Accordingly, the next read retry operation may use RR2 as the next set of read threshold voltages for the subsequent read operation, as shown by the hash marks. RR2 may include read threshold voltages V7, V8, and V9 whose read threshold voltages are shown in FIG. 5. Read threshold voltages V7, V8, and V9 may be positioned to differentiate between all the programmed charge states. Thus, the read threshold voltages V7, V8, and V9 may be sufficient to identify the correct charge states for all of the cells in the block and the read retry operation using RR2 may succeed.

In some instances, several read operations may be performed using the selected set of read threshold voltages before using a subsequent set of read threshold voltages. For instance, RR0 may be used for a certain number of successive read operations before performing a read retry operation using RR1. In some embodiments, a threshold number of tries can occur before a subsequent set of read threshold voltages is used. Once a read operation fails a threshold number of times, it can be determined that read retry table 600 needs to be updated.

If the read retry table contains sets of read threshold voltages that cause the read operation to fail and the read retry table is not updated, the device will repeatedly fail those read operations when the block is read at a later time. This can increase latency and the number of read failures, which can get worse as the consumer continues to use the device and subject it to additional stress. According to some embodiments of the present disclosure, a read retry table can be updated with a new grouping of sets of read threshold voltages that does not contain sets of read threshold voltages that have caused read operations to fail. That way, those sets of read threshold voltages that are known to fail may not be used again, thereby increasing read latency and accuracy. This can improve the memory devices latency far into its lifespan after being sold and used by a consumer. The new grouping can include a plurality of sets of read threshold voltages where the first set of read threshold voltages is the set of read threshold voltages used in the last successful read, and the subsequent sets of read threshold voltages can be the sets of read threshold voltages that are closest to an immediately prior set of read threshold voltages when plotted in read voltage space, as will be discussed further herein.

Figures 7, 8:
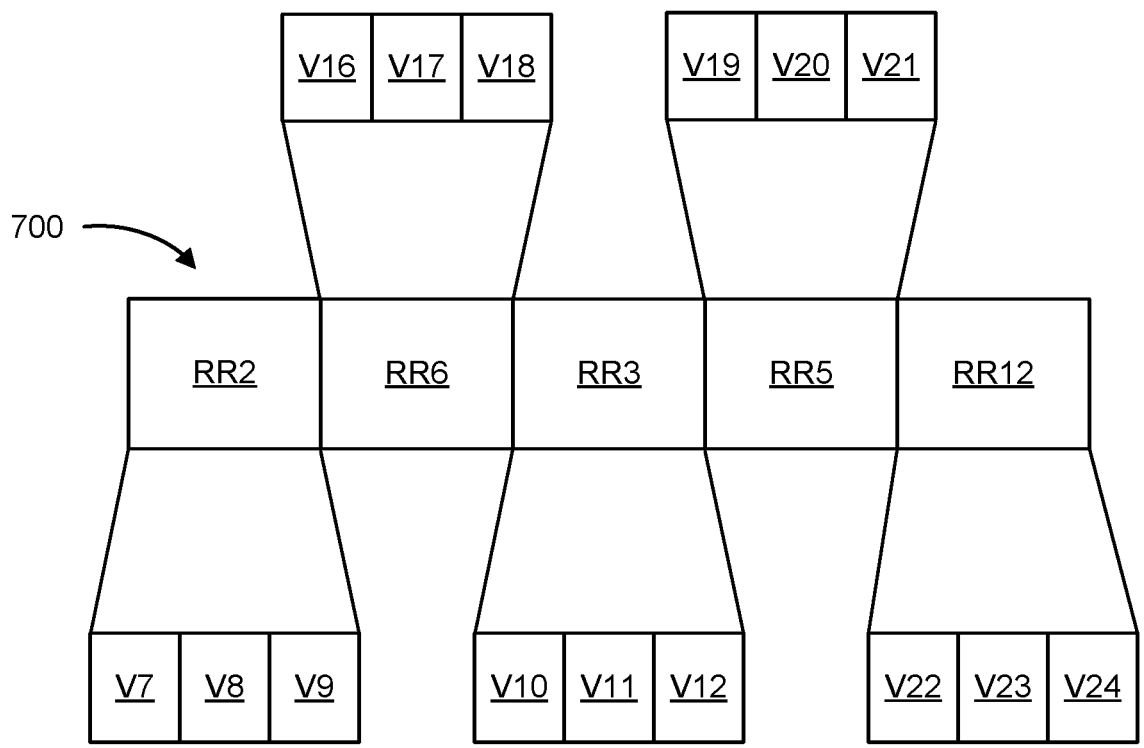
FIG. 7 is an example updated RRT that has been updated with one or more sets of read threshold voltages determined according to a read retry neighbor table, according to some embodiments of the present disclosure.
FIG. 8 is an example read retry neighbor table, according to some embodiments of the present disclosure.

FIG. 7 is an example updated RRT 700 that has been updated with one or more sets of read threshold voltages determined according to a read retry neighbor table, according to some embodiments of the present disclosure. Continuing with the examples discussed in FIG. 6 where the read retry operation using RR2 was successful, the initial set of read threshold voltages for RRT 700 may be set as RR2 because RR2 resulted in the previous successful read retry operation. Thus, subsequent read operations for reading the block may use the set of read threshold voltages that resulted in the last successful read operation. The remaining fields of sets of read threshold voltages can be filled in using sets of read threshold voltages identified from a read retry neighbor table.

FIG. 8 is an example read retry neighbor table 800, according to some embodiments of the present disclosure. Read retry neighbor table 800 can be a table that is stored in local memory of a NAND flash memory device that establishes relationships between sets of read threshold voltages. In some embodiments, read retry neighbor table 800 includes a first column 802 that lists all of the available sets of read threshold voltages RR0-RRN in ascending order. The number of available sets of read threshold voltages can be defined by the hardware of the flash memory device. The hardware may be configured to read according to a finite number of sets of read threshold voltages. In one example, a flash memory device can have 50 distinct sets of read threshold voltages where no two sets of read threshold voltages are the same. The second and subsequent columns can be arranged according to sets of read threshold voltages that are closest to the corresponding set of read threshold voltage in first column 802. For example, with reference to set of read threshold voltages RR0, a first nearest neighbor 804 can be RR1, a second nearest neighbor 806 can be RR3, and an Nth nearest neighbor 808 (e.g., farthest neighbor) can be RR27.

Figure 9:
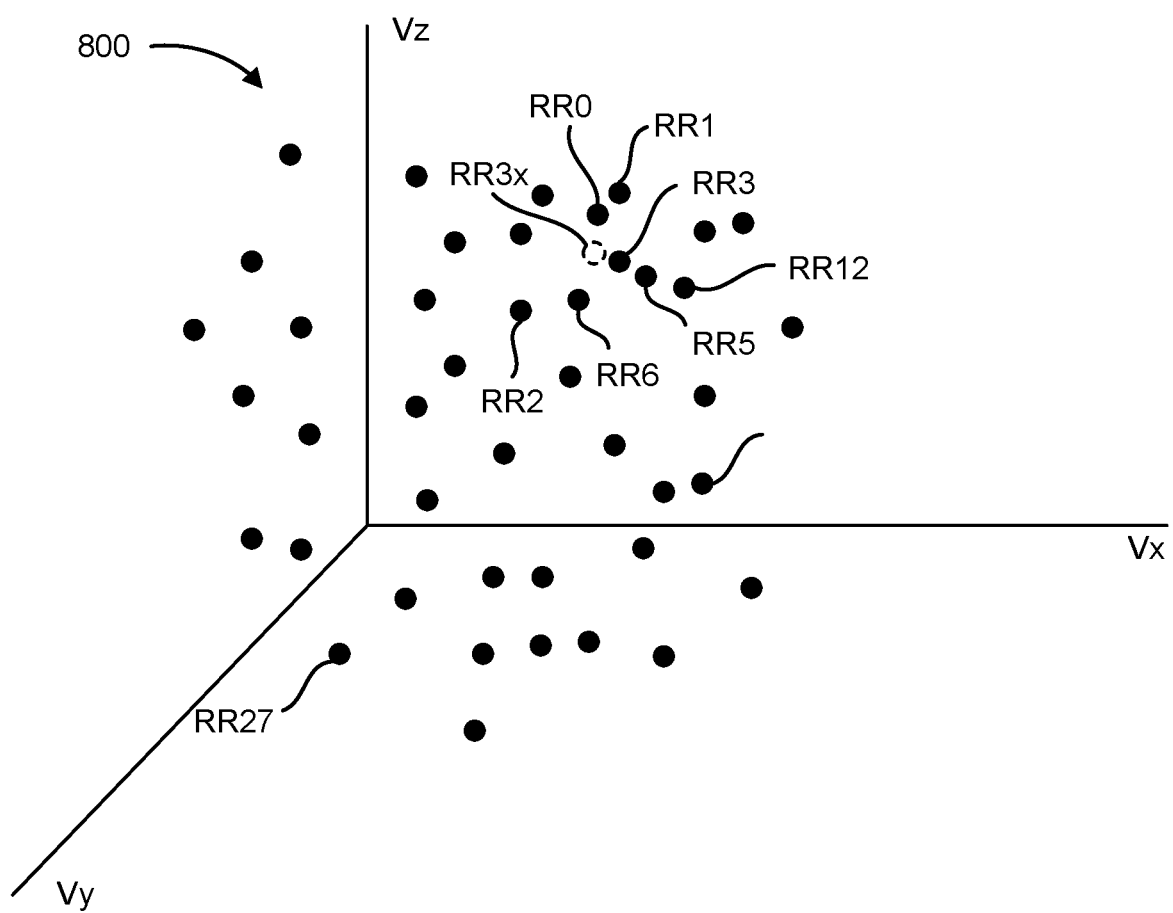
FIG. 9 is a graph illustrating an example graphical representation of sets of read threshold voltages plotted in read voltage space, according to some embodiments of the present disclosure.

The distance between sets of threshold voltages can be determined according to a distance function when applied to the sets of threshold voltages plotted in read voltage space. FIG. 9 is a graph 900 illustrating an example graphical representation of sets of read threshold voltages plotted in read voltage space, according to some embodiments of the present disclosure. Each set of read threshold voltage can be a multi-dimensional data point where each data point corresponds to a dimension of read voltage space in graph 900. Continuing with the MLC NAND flash device example, since each set of read threshold voltages can contain three read threshold voltages for reading charge states P1, P2, and P3, each set of read threshold voltages can be a three-dimensional data point plotted in read voltage space containing three axes: Vx, Vy, and Vz. All of the 50 sets of read threshold voltages can be plotted in the read voltage space and be shown as graph 900. Given that the sets of read threshold voltages are points in a three-visional coordinate space when plotted in read voltage space, the distance between two sets of read threshold voltages (RR) can be determined according to the following distance function:

$$d(RR_1, RR_2) = \sqrt{((Vx_2 - Vx_1)^2 + (Vy_2 - Vy_1)^2 + (Vz_2 - Vz_1)^2)}$$

where the function d represents the distance between $RR_1$ and $RR_2$. It can be understood that embodiments showing a three-dimensional read voltage space is merely exemplary and that other embodiments can have more or less than three-dimensions in read voltage space. For instance, triple level cell (TLC) flash memory devices that have three bits of data per charge state can have seven dimensions (one for the erase charge state and seven for the program charge states).

With this formula, the distance between sets of read threshold voltages can be used to fill out the read retry neighbor table so that sets of read threshold voltages closes to certain other sets of read threshold voltages can be identified. As an example, the closest set of read threshold voltages to RR0 can be RR1, the second closest set of read threshold voltages to RR0 can be RR3, and the farthest set of read threshold voltages to RR0 can be RR27, which can be reflected in the row for RR0 of read retry neighbor table 800 in FIG. 8. Each row can establish the same information for the respective set of read threshold voltages in first column 802.

With this in mind, filling out the updated RRT 700 in FIG. 7 can be discussed in more detail. As aforementioned herein, RR2 may be the last set of read threshold voltages that resulted in a successful read operation following one or more unsuccessful reads using each set of read threshold voltages RR0 and RR1. Thus, the initial set of read threshold voltages for RRT 700 can be defined as RR2. The next set of read threshold voltages can be the set of read threshold voltages that is closest to RR2 in read voltage space. Referencing read retry neighbor table 800 in FIG. 8, the set of read threshold voltages closest to RR2 can be RR6. Thus, the second set of read retry threshold voltages in RRT 700 can be RR6. The next set of read threshold voltages can be the set of read threshold voltages that is closest to RR6 in read voltage space. Referencing read retry neighbor table 800 in FIG. 8, the set of read threshold voltages closest to RR6 can be RR3. This logic can be repeated until all fields in RRT 700 are filled, thereby resulting in RR5 and RR12 filling in the last two fields. The graphical representation of these sets of read threshold voltages can be seen in FIG. 9, which shows graph 900 that includes the sets of read threshold voltages as data points. As shown in FIG. 9, RR6 is closest RR2, RR3 is closest to RR6, RR5 is closest to RR3 and RR12 is closest to RR5.

In some embodiments, if the closest set of read threshold voltages that is identified for filling in a field in the RRT but that has already been used before and resulted in a read failure, the next closest set of read threshold voltage can be used. For instance, if the read threshold voltages of RR3 were actually arranged so that RR3 was positioned at RR3x shown in FIG. 9, then RR0 would be closest to RR3x. However, since RR0 was already used in a previous read operation that resulted in a read failure, RR0 may not be selected and instead, the second closest set of read threshold voltages (e.g., the set of read threshold voltages in second nearest neighbor column 806) may be selected. In some embodiments, sets of read threshold voltages that result in a read fail may be flagged in the local memory so that subsequent operations executed to update the RRT may avoid using those sets of read threshold voltages. For instance, RR0 may be set with a flag of "1" that indicates it has already been used in a failed read operation, whereas RR5 and all other sets of read threshold voltages other than RR1 may be set with a flag of "0" indicating that they have not yet resulted in a failed read operation.

By updating the RRT with the most recent set of read threshold voltages that resulted in a successful read operation and filling in the rest of the fields with sets of threshold voltages that are closest to the immediately prior set of threshold voltages in read voltage space, the updated RRT can maximize the chances of a successful read for subsequent read operations as well as improve the read latency. The read latency can be improved because the initial set of read threshold voltages is the most recent set used that resulted in a successful read operation, and if the initial set of read threshold voltages somehow results in a failed read operation, the subsequent set of read threshold voltages that are the most similar to the initial set of read threshold voltages can be used.

Figure 10:
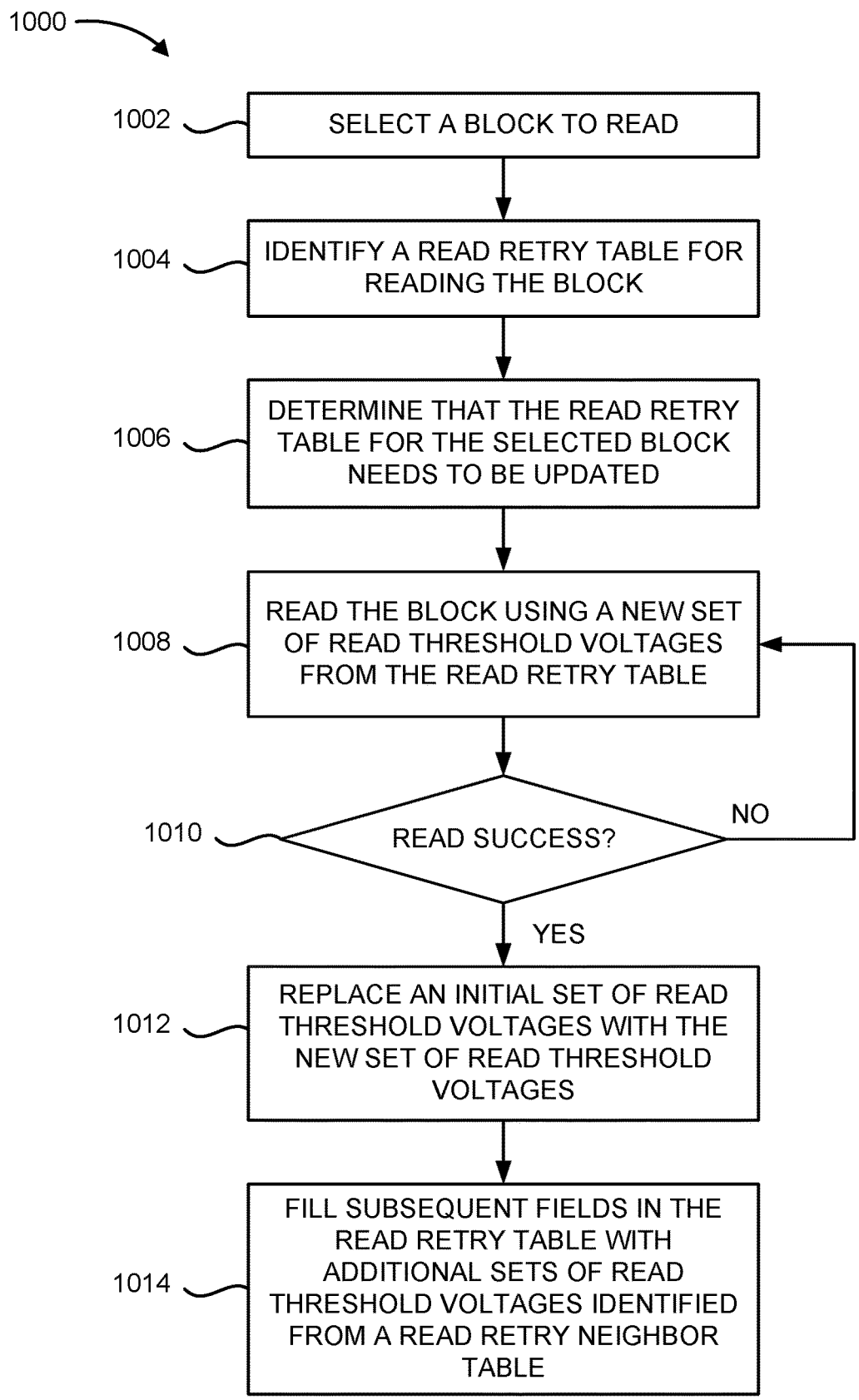
FIG. 10 is a flow chart for an example method of updated a read retry table, according to some embodiments of the present disclosure.

FIG. 10 is a flow chart for an example method 1000 of updated a read retry table, according to some embodiments of the present disclosure. Method 1000 can be a computer-readable medium that can be executed by a processor to instruct the processor to perform one or more of the following functions. At block 1002 a block of memory can be selected to be read. For instance, a block, e.g., block 0 in FIG. 2, of bulk memory, e.g., bulk memory 108 in FIG. 1, can be selected to be read by a flash memory controller, e.g., flash memory controller 106 in FIG. 1. The block can contain information that host device, e.g., host device 102 in FIG. 1, has requested to read.

Then, at block 1004, a read retry table for reading the selected block can be identified. For instance, the flash memory controller can select the read retry table associated with the selected block. The read retry table can be a default read retry table, e.g., RRT 400 in FIG. 4, that has not yet been updated due to one or more failed read operations. The default read retry table can be set by designers of the flash memory device and can be designed to read blocks of memory whose cells operate as intended and before being subjected to stresses such as excessive program and erase cycles and/or excessively high and low temperatures. In alternative embodiments, the read retry table can be a previously updated read retry table.

At block 1006, it can be determined, by the flash memory controller, that the read retry table needs to be updated. There may be many ways in which the read retry table is determined to need an update. For example, the read retry table can be determined to need an update in the event of one failed read operation. The one failed read operation can be a failed read operation using the initial set of read threshold voltages. As an example, a read operation using RR0 in RRT 400 of FIG. 4 can cause the read operation to fail, as discussed herein with respect to FIG. 6. In another example, the read retry table can be determined to need an update when a threshold number of read operation failures has occurred. The read operation failures can be a series of read operation failures that all use the same initial set of read threshold voltages. As an example, five read operations, all using RR0 in RRT 400 of FIG. 4, can be executed, and all may need to fail in order for the flash memory controller to determine that the read retry table needs to be updated. By having the method perform a threshold number of read operations before determining that the read retry table needs to be updated, the method can confirm that the read retry table needs to be updated rather than merely encountering a spontaneous read failure due to other reasons unrelated to the read threshold voltages. This can improve the accuracy of the read retry table, thereby improving the accuracy and latency of subsequent read operations.

At block 1008, the block of memory can be read using a new set of read threshold voltages from the read retry table. The new set of read threshold voltages can be a set of read threshold voltages that is immediately subsequent to the set of read threshold voltages that caused the flash memory controller to determine that the read retry table needs to be updated at block 1006. As an example, the block of memory can be read using RR1 in RRT 400 of FIG. 4 if RR0 caused the initial read operation to fail, as discussed herein with respect to FIG. 6.

If the new set of read threshold voltages does not result in a successful read, then method 1000 can loop back to block 1008 where the block is read using another new set of read threshold voltages. The new set of read threshold voltages can be a set of read threshold voltages subsequent to the set of read threshold voltages that most recently caused the read operation to fail. For instance, the block of memory can be read using RR2 in RRT 400 of FIG. 4 if RR0 and RR1 both caused the read operations to fail, as discussed herein with respect to FIG. 6. This loop of reading the block with a new set of read threshold voltages can continue until a set of read threshold voltages results in a successful read.

If the new set of read threshold voltages does result in a successful read, then at block 1012, an initial set of read threshold voltages can be replaced with the new set of read threshold voltages by the flash memory controller. For instance, if RR2 in RRT 400 of FIG. 4 results in a successful read, then the initial field for sets of read threshold voltages can be set as RR2, as discussed herein with respect to FIG. 7.

Then, at block 1014, subsequent fields in the read retry table can be filled with additional sets of read threshold voltages identified from a read retry neighbor table. For instance, fields 2-5 for a five-field read retry table can be filled with RR6, RR3, RR5, and RR12 identified from read retry neighbor table 800 in FIG. 8, as discussed herein with respect to FIGS. 7-8. The read retry neighbor table can be populated with data pertaining to the distance between sets of read threshold voltages when plotted in read voltage space. In this space, each set of read threshold voltage can be a multi-dimensional data point that exists as a point in the read voltage space, as discussed herein with respect to FIG. 9.

Although the present disclosure has been described with respect to specific embodiments, it will be appreciated that the present disclosure is intended to cover all modifications and equivalents within the scope of the following claims.

What is claimed is:

1. A method for reading data from storage, comprising:
   selecting a block of memory to read, the block of memory being a portion of a bulk memory in a memory device configured to store bits of data;
   identifying a read retry table for reading the block, the read retry table including a plurality of fields containing an initial set of read threshold voltages in a first field and a plurality of subsequent sets of read threshold voltages in a plurality of fields subsequent to the first field;
   determining that the read retry table for the selected block of memory needs to be updated;
   reading the block of memory using a new set of read threshold voltages from the read retry table, the new set of read threshold voltages being one of the plurality of subsequent sets of read threshold voltages in the read retry table;
   in response to a determination that the block has been read successfully using the new set of read threshold voltages, replacing the initial set of read threshold voltages in the first field with the new set of read threshold voltages; and
   filling the plurality of subsequent fields in the read retry table with additional sets of read threshold voltages identified from a read retry neighbor table to create an updated read retry table, wherein at least one of the additional sets of read threshold voltages is closest in distance to the initial set of read threshold voltages in read voltage space.

2. The method of claim 1, wherein determining that the read retry table for the selected block of memory needs to be updated comprises:
   performing a first read operation on the block of memory using the initial set of read threshold voltages; and
   determining that the first read operation results in a failed read operation.

3. The method of claim 2, wherein determining that the read retry table for the selected block of memory needs to be updated further comprises:
   performing at least a second read operation on the block of memory using the initial set of read threshold voltages; and
   determining that the at least a second read operation results in a number of failed read operations that exceeds a threshold number of failed read operations.

4. The method of claim 1, wherein the read retry table is a default read retry table designed to set read threshold voltages for reading the memory device in an unstressed condition.

5. The method of claim 4, wherein the updated read retry table is different from the read retry table and is designed to set read threshold voltages for reading the memory device in a stressed condition.

6. The method of claim 5, wherein the stressed condition is defined by charge states of programmed cells in the block of memory whose voltage levels has shifted from their initial states after the memory device has undergone a number of program and erase cycles.

7. The method of claim 1, wherein the read retry neighbor table includes a first column listing a first plurality of sets of read threshold voltages, and at least one second column listing at least one other plurality of sets of read threshold voltages.

8. The method of claim 7, wherein the first plurality of sets of read threshold voltages are available sets of read threshold voltages capable of being used by the memory device, and wherein the sets of read threshold voltages in the at least one other plurality of sets of read threshold voltages is identified according to its distance to a corresponding set of read threshold voltages in the first plurality of sets of read threshold voltages.

9. The method of claim 8, wherein the at least one other plurality of sets of read threshold voltages is arranged by separation distance to the first plurality of sets of read threshold voltages by increasing separation distances.

10. The method of claim 1, wherein the read retry table and the read retry neighbor table are stored in local memory of the memory device.

11. A memory device, comprising:
    a processor;
    bulk memory communicatively coupled with the processor and comprising a plurality of blocks of bulk memory configured to store data;
    local memory communicatively coupled with the processor and including a read retry table, a read retry neighbor table, and computer-readable instructions, wherein:
      the read retry table contains several sets of read threshold voltages for reading the plurality of blocks of bulk memory that are arranged in a sequential order;
      the read retry neighbor table contains information pertaining to a spatial relationship between sets of read threshold voltages in read voltage space; and
      the computer-readable instructions upon execution by the processor configure the memory device to:
        select a block of memory from the plurality of blocks of bulk memory to read;
        identify the read retry table for reading the block, the read retry table including a plurality of fields containing an initial set of read threshold voltages in a first field and a plurality of subsequent sets of read threshold voltages in a plurality of fields subsequent to the first field;
        determine that the read retry table for the selected block of memory needs to be updated;
        read the block of memory using a new set of read threshold voltages from the read retry table, the new set of read threshold voltages being one of the plurality of subsequent sets of read threshold voltages in the read retry table;
        in response to a determination that the block has been read successfully using the new set of read threshold voltages, replace the initial set of read threshold voltages in the first field with the new set of read threshold voltages; and
        fill the plurality of subsequent fields in the read retry table with additional sets of read threshold voltages identified from the read retry neighbor table to create an updated read retry table, wherein at least one of the additional sets of read threshold voltages is closest in distance to the initial set of read threshold voltages in read voltage space.

12. The memory device of claim 11, wherein the read retry table is a default read retry table designed to set read threshold voltages for reading the memory device in an unstressed condition.

13. The memory device of claim 12, wherein the updated read retry table is different from the read retry table and is designed to set read threshold voltages for reading the memory device in a stressed condition.

14. The memory device of claim 11, wherein the read retry neighbor table includes a first column listing a first plurality of sets of read threshold voltages, and at least one second column listing at least one other plurality of sets of read threshold voltages.

15. The memory device of claim 14, wherein the first plurality of sets of read threshold voltages are available sets of read threshold voltages capable of being used by the memory device, and wherein the sets of read threshold voltages in the at least one other plurality of sets of read threshold voltages is identified according to its distance to a corresponding set of read threshold voltages in the first plurality of sets of read threshold voltages.

16. A computer system for reading data from storage, comprising:
   a host device comprising a host processor and a host memory device; and
   a memory device communicatively coupled to the host device and configured to store data from and send data to the host device, the memory device comprising:
      a memory device processor;
      bulk memory communicatively coupled with the memory device processor and comprising a plurality of blocks of bulk memory configured to store data;
      local memory communicatively coupled with the processor and including a read retry table, a read retry neighbor table, and computer-readable instructions, wherein:
         the read retry table contains several sets of read threshold voltages for reading the plurality of blocks of bulk memory that are arranged in a sequential order;
         the read retry neighbor table contains information pertaining to a spatial relationship between sets of read threshold voltages in read voltage space; and
         the computer-readable instructions upon execution by the processor configure the memory device to:
            select a block of memory from the plurality of blocks of bulk memory to read;
            identify the read retry table for reading the block, the read retry table including a plurality of fields containing an initial set of read threshold voltages in a first field and a plurality of subsequent sets of read threshold voltages in a plurality of fields subsequent to the first field;
            determine that the read retry table for the selected block of memory needs to be updated;
            read the block of memory using a new set of read threshold voltages from the read retry table, the new set of read threshold voltages being one of the plurality of subsequent sets of read threshold voltages in the read retry table;
            in response to a determination that the block has been read successfully using the new set of read threshold voltages, replace the initial set of read threshold voltages in the first field with the new set of read threshold voltages; and
            fill the plurality of subsequent fields in the read retry table with additional sets of read threshold voltages identified from the read retry neighbor table to create an updated read retry table, wherein at least one of the additional sets of read threshold voltages is closest in distance to the initial set of read threshold voltages in read voltage space.

17. The computer system of claim 16, wherein the read retry table is a default read retry table designed to set read threshold voltages for reading the memory device in an unstressed condition.

18. The computer system of claim 17, wherein the updated read retry table is different from the read retry table and is designed to set read threshold voltages for reading the memory device in a stressed condition.

19. The computer system of claim 16, wherein the read retry neighbor table includes a first column listing a first plurality of sets of read threshold voltages, and at least one second column listing at least one other plurality of sets of read threshold voltages.

20. The computer system of claim 19, wherein the first plurality of sets of read threshold voltages are available sets of read threshold voltages capable of being used by the memory device, and wherein the sets of read threshold voltages in the at least one other plurality of sets of read threshold voltages is identified according to its distance to a corresponding set of read threshold voltages in the first plurality of sets of read threshold voltages.

* * * * *